(12) United States Patent
Guzy et al.

(10) Patent No.: US 10,802,735 B1
(45) Date of Patent: Oct. 13, 2020

(54) SYSTEMS AND METHODS FOR RECONFIGURING DUAL-FUNCTION CELL ARRAYS

(71) Applicant: Arbor Company, LLLP, Glenbrook, NV (US)

(72) Inventors: Darrel James Guzy, Menlo Park, CA (US); Wei-Ti Liu, Saratoga, CA (US)

(73) Assignee: Arbor Company, LLLP, Glenbrook, NV (US)

( * ) Notice: Subject to any disclaimer, the term of this patent is extended or adjusted under 35 U.S.C. 154(b) by 0 days.

(21) Appl. No.: 16/810,779

(22) Filed: Mar. 5, 2020

Related U.S. Application Data

(63) Continuation-in-part of application No. 16/777,554, filed on Jan. 30, 2020, now abandoned.

(60) Provisional application No. 62/837,704, filed on Apr. 23, 2019, provisional application No. 62/850,996, filed on May 21, 2019, provisional application No. 62/837,704, filed on Apr. 23, 2019.

(51) Int. Cl.
*G06F 3/06* (2006.01)

(52) U.S. Cl.
CPC .......... *G06F 3/0632* (2013.01); *G06F 3/0604* (2013.01); *G06F 3/064* (2013.01); *G06F 3/0679* (2013.01)

(58) Field of Classification Search
CPC ...... G06F 3/0632; G06F 3/064; G06F 3/0604; G06F 3/0679
See application file for complete search history.

(56) References Cited

U.S. PATENT DOCUMENTS

| | | | | |
|---|---|---|---|---|
| 5,737,766 A | * | 4/1998 | Tan | H03K 19/1736 365/189.08 |
| 5,844,844 A | * | 12/1998 | Bauer | G11C 11/41 365/189.05 |
| 6,091,262 A | * | 7/2000 | New | H03K 19/17704 326/37 |
| 6,263,400 B1 | * | 7/2001 | Rangasayee | G11C 11/41 365/49.17 |
| 6,441,641 B1 | | 8/2002 | Pang et al. | |
| 6,894,527 B1 | | 5/2005 | Donlin et al. | |

(Continued)

OTHER PUBLICATIONS

International Patent Application No. PCT/US2020/029163, International Search Report and Written Opinion dated Jul. 17, 2020, 10 pages.

(Continued)

*Primary Examiner* — Hiep T Nguyen
(74) *Attorney, Agent, or Firm* — Sheppard, Mullin, Richter & Hampton LLP

(57) ABSTRACT

An integrated circuit die element comprises one or more field-programmable gate arrays (FPGAs) elements; a reconfigurable dual function memory array, the reconfigurable dual function memory array including a plurality of reconfigurable memory array blocks, each reconfigurable memory array block being capable of configuration and reconfiguration as a storage memory array block or as a control logic array block for controlling at least a portion of the one or more FPGA elements; and a control logic circuit functioning to configure each reconfigurable memory array block as the respective memory array block or as the respective logic array block for controlling the one or more FPGA elements.

18 Claims, 16 Drawing Sheets

(56) References Cited

U.S. PATENT DOCUMENTS

| | | |
|---|---|---|
| 6,931,543 B1 | 8/2005 | Pang et al. |
| 7,117,373 B1 | 10/2006 | Trimberger et al. |
| 7,126,214 B2 | 10/2006 | Huppenthal et al. |
| 7,429,926 B1 | 9/2008 | Drimer |
| 9,779,016 B1 | 10/2017 | Shen et al. |
| 2001/0015919 A1 | 8/2001 | Kean |
| 2004/0000928 A1* | 1/2004 | Cheng ............... H03K 19/1737 326/41 |
| 2005/0059377 A1 | 3/2005 | Schucker et al. |
| 2005/0242836 A1* | 11/2005 | Goetting ........ G01R 31/318516 326/39 |
| 2006/0001137 A1 | 1/2006 | Hundt et al. |
| 2006/0059345 A1 | 3/2006 | Fayad et al. |
| 2007/0094534 A1 | 4/2007 | Andreev et al. |
| 2007/0288765 A1 | 12/2007 | Kean |
| 2008/0272803 A1 | 11/2008 | Balasubramanian et al. |
| 2010/0205470 A1 | 8/2010 | Moshayedi et al. |
| 2015/0262633 A1 | 9/2015 | Lee |
| 2016/0248588 A1* | 8/2016 | Langhammer ........ H04L 9/3242 |
| 2016/0380635 A1* | 12/2016 | Roberts ............ H03K 19/17728 326/38 |
| 2017/0123674 A1 | 5/2017 | Mori et al. |
| 2017/0179096 A1* | 6/2017 | Dang ..................... H01L 24/32 |
| 2018/0047663 A1 | 2/2018 | Camarota |
| 2020/0065263 A1* | 2/2020 | Liff ..................... H01Q 13/106 |
| 2020/0117261 A1 | 4/2020 | Piwonka et al. |
| 2020/0174783 A1 | 6/2020 | Yamada et al. |

OTHER PUBLICATIONS

International Patent Application No. PCT/US2020/029010, International Search Report and Written Opinion dated Jul. 21, 2020, 7 pages.

* cited by examiner

← 1100

|  | R₀ | R₁ | R₂ | R₃ | R₄ | R₅ | R₆ | R₇ |
|---|---|---|---|---|---|---|---|---|
| Ex. 3 | 1 | 1 | 0 |  |  |  |  |  |
|  | Vref LR | Vref T | Vref HR |  |  |  |  |  |

Set → Vref LR,  <u>Case A₃</u>

|  | R₀ | R₁ | R₂ | R₃ | R₄ | R₅ | R₆ | R₇ |
|---|---|---|---|---|---|---|---|---|
| Ex. 4 | 1 | 0 | 0 |  |  |  |  |  |
|  | Vref LR | Vref T | Vref HR |  |  |  |  |  |

Not recommended case → Weak bit

Note:
Detecting two passing Vref states to use one Vref as input of S/A

| Reference Input |

FIG. 11

Custom Function Block Design Examples:

• Logic Functions are fixed function blocks Adder or Multiplier

Full Adder

SYSTEMS AND METHODS FOR RECONFIGURING DUAL-FUNCTION CELL ARRAYS

CROSS-REFERENCE TO RELATED APPLICATIONS

The present application claims the benefit of U.S. Provisional Patent Application Ser. No. 62/837,704, filed Apr. 23, 2019 and entitled "Reconfigurable Processor Module Comprising Hybrid Stacked Integrated Circuit Die Elements," and U.S. Provisional Patent Application Ser. No. 62/850,996, filed May 21, 2019 and entitled "Integrating Battery with 3D Die-Stacking Elements," each of which are hereby incorporated by reference herein. The present application is also a continuation-in-part of U.S. patent application Ser. No. 16/777,554, filed Jan. 30, 2020 and entitled "Systems and Methods for Reconfiguring Dual-Function Cell arrays," which claims the benefit of U.S. Provisional Patent Application No. 62/837,704 filed on Apr. 23, 2019 and entitled "Reconfigurable Processor Module Comprising Hybrid Stacked Integrated Circuit Die Elements," and U.S. Provisional Patent Application No. 62/850,996 filed on May 21, 2019 and entitled "Integrating Battery with 3D Die-Stacking Elements," each of which are hereby incorporated by reference herein.

TECHNICAL FIELD

This disclosure pertains to cells arrays (e.g., memory arrays).

BACKGROUND

One solution to address increasing processing demands involves moving memory closer to the processor. Another solution uses 3D stacked memories and logic for data-intensive architecture to improve bandwidth, power consumption and density. Leveraging heterogeneous 3D integration of memory and bottom logic layer (FPGA/PLD), which connects to the host's I/O ports, moves part of the computation to where the data resides, which can provide improved processing-in-memory (PIM) performance. PIM may reduce data movement, thereby resulting in reduced memory access time and energy consumption. See U.S. Pat. No. 7,126,214.

Conventional FPGAs/PLDs offer fixed memory size. Yet, specific applications may have different memory and/or logic requirements. For example, one application may require more memory than another. When an application requires more memory, conventional systems use external memory. Using external memory slows system performance and consumes excess energy. Other solutions would be helpful.

SUMMARY

Various embodiments of the present disclosure provide integrated circuit die element comprising one or more field-programmable gate arrays (FPGAs) elements. A reconfigurable dual function memory array includes a plurality of reconfigurable memory array blocks. Each reconfigurable memory array block is capable of configuration and reconfiguration as a storage memory array block or as a control logic array block for controlling at least a portion of the one or more FPGA elements. A control logic circuit functions to configure each reconfigurable memory array block as the respective memory array block or as the respective logic array block for controlling the one or more FPGA elements.

In some embodiments, the plurality if reconfigurable memory array blocks comprises a matrix of reconfigurable memory array blocks.

In some embodiments, the reconfigurable dual function memory array includes a first reconfigurable memory array block configured as the storage memory array block, and a second reconfigurable memory array block configured as the control logic array block for controlling a particular set of FPGAs.

In some embodiments, the storage memory array block comprises cache memory.

In some embodiments, the control logic circuit functions to configure at least one reconfigurable memory array block after manufacturing and deployment of the integrated circuit die element.

In some embodiments, each reconfigurable memory array block comprises a plurality of programmable memory cells.

In some embodiments, the control logic circuit functions to switch a particular reconfigurable memory array block from the storage memory array block to the control logic array block.

In some embodiments, the control logic circuit functions to switch the particular reconfigurable memory array block from the control logic array block to the particular memory array block.

In some embodiments, the integrated circuit die element comprises a stack of integrated circuit dies, the stack including a first dual function memory array die and a microprocessor die.

In some embodiments, the stack further comprises a second dual function memory array die.

In some embodiments, the stack further comprises an FPGA die or memory die.

Various embodiments of the present disclosure includes methods configured to store, by a control logic circuit, a first control value. Configure, based on the first control value, at least one reconfigurable memory array block of a reconfigurable dual function memory array as a storage memory array. Each reconfigurable memory array block of the reconfigurable dual function memory array is capable of configuration and reconfiguration as a storage memory array block or a control logic array block for controlling one or more field-programmable gate arrays (FPGAs). Modify, by the control logic circuit, a second control value. Reconfigure, based on the second control value, the at least one reconfigurable memory array block to a control logic array.

In some embodiments, the plurality of reconfigurable memory array blocks comprises a matrix of reconfigurable memory array blocks.

In some embodiments, the reconfigurable dual function memory array includes a first reconfigurable memory array block configured as the storage memory array block, and a second reconfigurable memory array block configured as the control logic array for controlling one or more FPGAs.

In some embodiments, the storage memory array comprises cache memory.

In some embodiments, the control logic circuit functions to configure at least one reconfigurable memory array block after manufacturing and deployment of the integrated circuit die element.

In some embodiments, each reconfigurable memory array block comprises a plurality of programmable memory cells.

In some embodiments, the method is further configured to switch, by the control logic circuit, a particular memory array block from the storage memory array block to the control logic array block.

In some embodiments, the method is further configured to switch, by the control logic circuit, the particular control logic array block from the control logic array block to the particular memory array block.

In some embodiments, the integrated circuit die element comprises a stack of integrated circuit dies, the stack including a first dual function memory array die and a microprocessor die.

In some embodiments, the stack further comprises a second dual function memory array die.

In some embodiments, the stack further comprises an FPGA die or memory die.

These and other features of the systems, methods, and non-transitory computer readable media disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for purposes of illustration and description only and are not intended as a definition of the limits of the invention.

BRIEF DESCRIPTION OF THE DRAWINGS

FIG. 11 is a block diagram of an example of setting status registers for scan logic and reference array for case A3 and case A4 according to some embodiments.

DETAILED DESCRIPTION

In various embodiments, reconfigurable dual-function function cell arrays can be configured and reconfigured into logic or storage memory cells on the same integrated circuit die. For example, a reconfigurable dual-function function cell array may include a memory array (or matrix) of programmable memory cells that can be configured and reconfigured to function either as control memory for FPGA logic or as storage memory (e.g., cache). For sake of simplicity, the terms "configure" or "reconfigure" may each refer to a configuration (e.g., an initial configuration) and/or a reconfiguration of a prior configuration (e.g., a second or subsequent configuration).

In some embodiments, a processing system includes any number of such reconfigurable dual-function function cell arrays. A control logic circuit of the processing system may configure programmable cells of a reconfigurable dual-function function cell array to function as a storage memory array, and configure programmable cells of another reconfigurable dual-function function cell array to function as a logic array. If, for example, more storage memory (e.g., fast access memory, cache, etc.) is needed for a particular application, the processing system may reconfigure the programmable cells operating as a logic array to function as a storage memory array. In another example, if additional logic is required, the processing system may reconfigure the programmable cells operating as a storage memory array to function as a logic array. Since storage memory and logic functionality may be increased or decreased as needed (e.g., on demand), external storage memory may not be needed or may be needed less often. This can improve system performance and/or consume less energy than traditional systems.

In various embodiments, the reconfigurable dual-function cell arrays may use non-volatile memory and/or volatile memory. Non-volatile memory may include phase change memory (PCM), MRAM, and EEPROM cells, and/or the like. PCM, in particular, may allow chip designs to provide high-density, low power, programmable and non-volatile memory devices. PCM may be beneficial in artificial intelligence chip design architecture, computation-in-memory (CIM), and/or the like. In one example, PCM may be used for CIM in neuromorphic computing.

Figure 1:
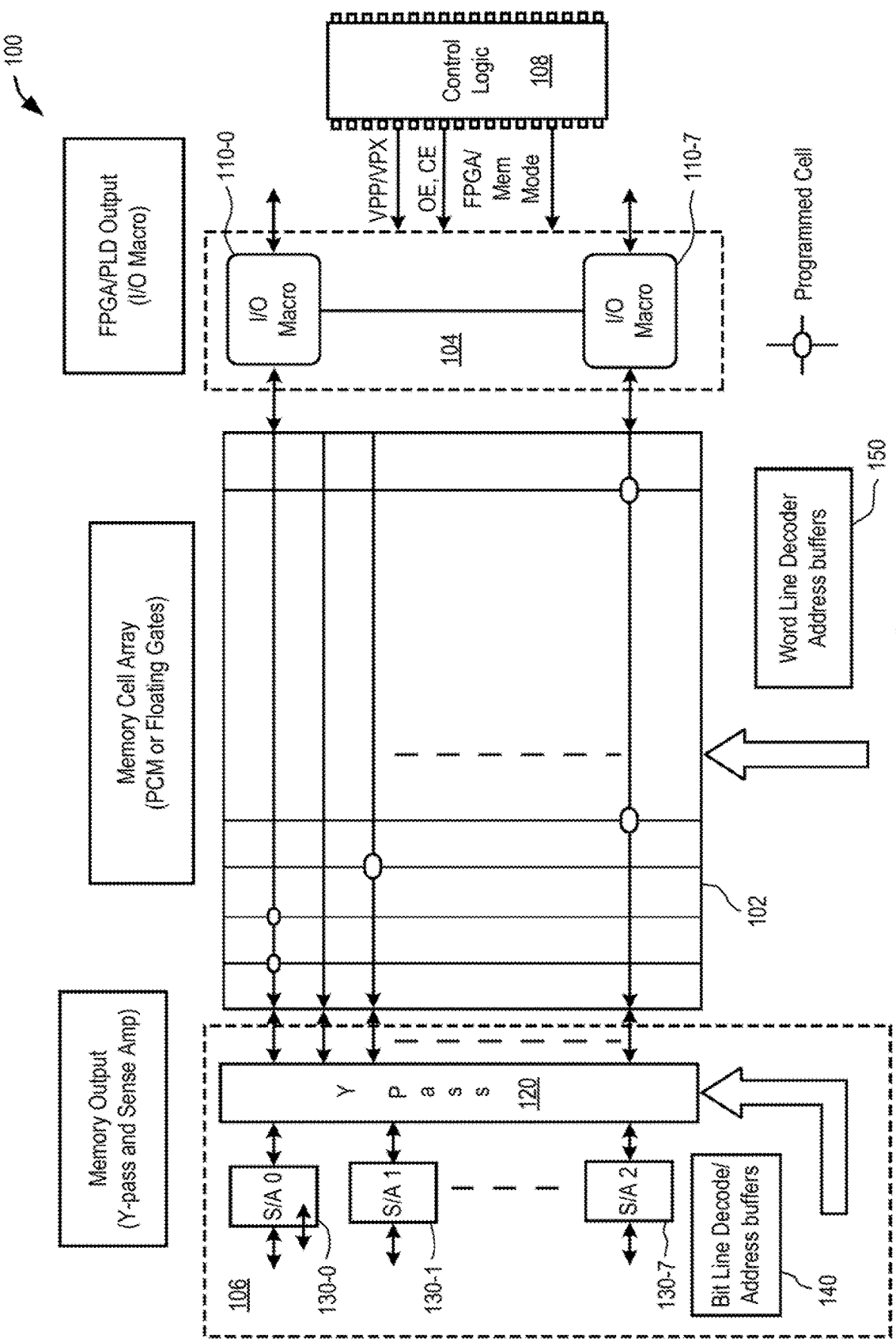
FIG. 1 is a block diagram of a processing system including a reconfigurable dual function cell array according to some embodiments.

FIG. 1 is a block diagram of a processing system 100 including a reconfigurable dual function cell array 102 according to some embodiments. The processing system 100 further includes FPGA elements 104 and storage memory elements 106. In some embodiments, the processing system 100 is implemented on a single integrated circuit die. In other embodiments, the processing system 100 is implemented on multiple integrated circuit dies. For example, the reconfigurable dual-function cell array 102, the FPGA circuitry 104, and/or the storage memory circuitry 106 may be implemented across multiple integrated circuit dies. The processing system 100 further includes control logic 108 that functions to configure the various cells of the reconfigurable dual-function cell array 102 as a memory array or as a logic array.

The reconfigurable dual-function function cell array 102 includes one or more arrays (e.g., a single array or a matrix of arrays) of programmable cells that can be reconfigured to function either as control memory cells for the FPGA elements 104 or as storage memory cells for the memory elements 106. As indicated above, the programmable cells may be non-volatile memory cells or volatile memory cells. The storage memory cells may function as fast access memory cells (e.g., cache), and the control memory cells may function as configuration data for configuring an FPGA. For example, the configuration data stored in the control memory cells can be used to configure the FPGA elements 104 to perform complex combinational functions, and/or relatively simple logic gates (e.g., AND, XOR). In some embodiments, both logic and memory cells can be created on the same reconfigurable dual-function cell array 102.

Any number of such reconfigurable dual-function function cell arrays 102 may be included in the processing system 100. In some embodiments, the processing system 100 can configure programmable cells of one reconfigurable dual-function function cell array 102 to function as a memory array, and configure programmable cells of another reconfigurable dual-function function cell array 102 to function as a logic array. If, for example, more memory is needed for a particular application, the processing system may reconfigure a logic array to function as a memory array. If, for example, more logic is needed for a particular application, the processing system may reconfigure a memory array to function as a logic array. Since memory and logic functionality may be increased or decreased as needed, use of external memory may be avoided. This can improve system performance and/or consume less energy than traditional systems.

Figure 15:
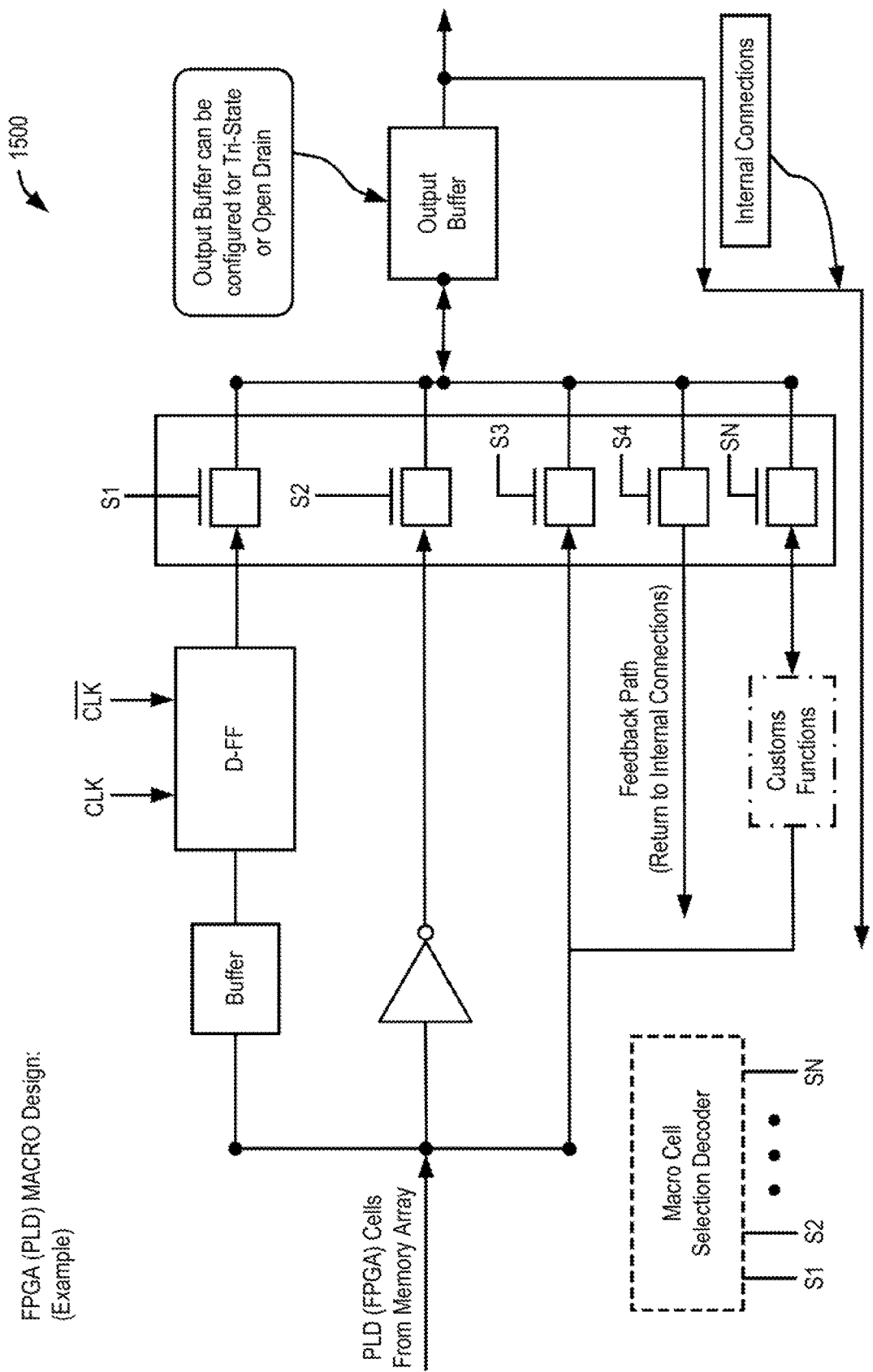
FIG. 15 is a block diagram of a reconfigurable dual function cell array macro design according to some embodiments.
Figure 16:
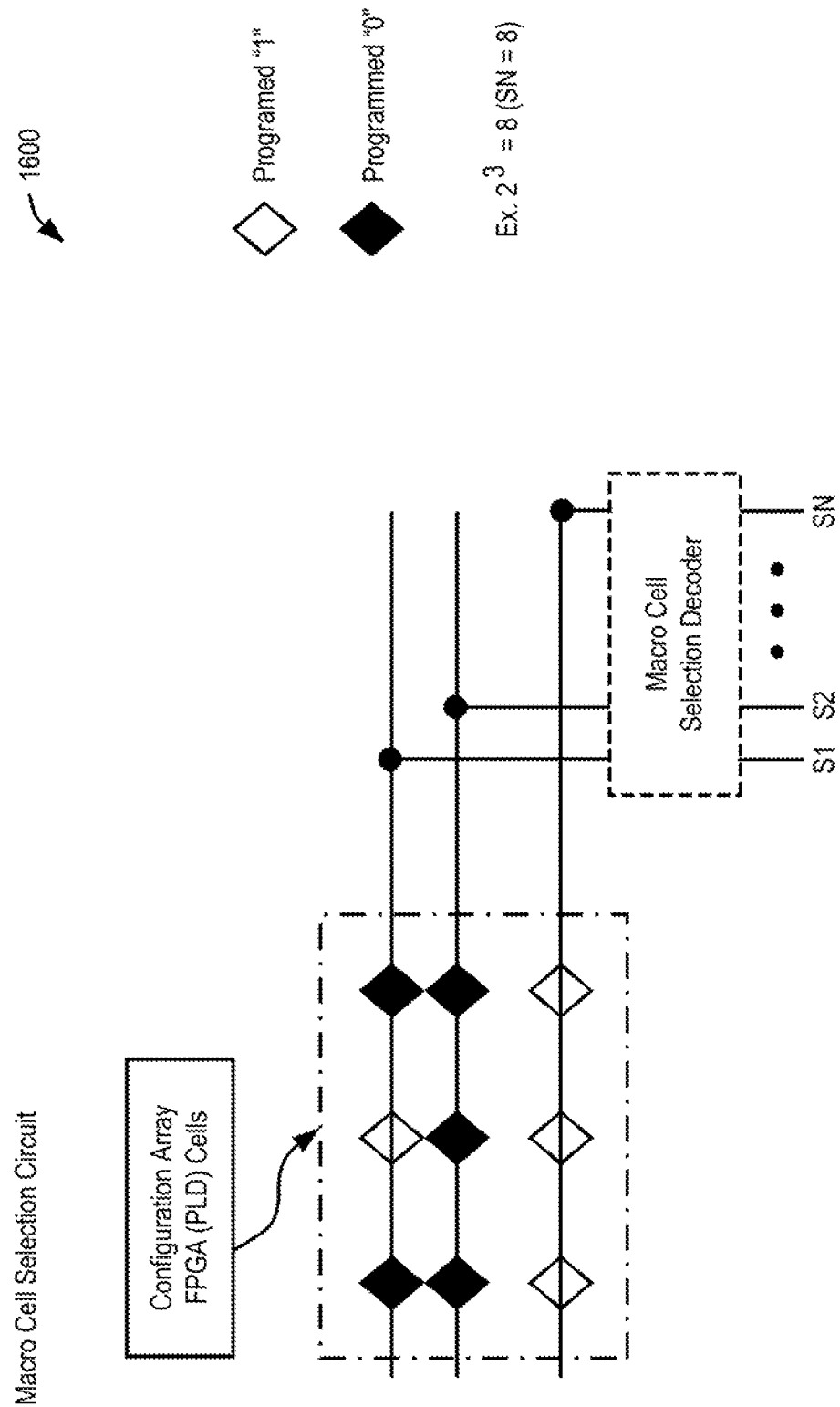
FIG. 16 is a block diagram of a reconfigurable dual function cell array macro cell selection circuit according to some embodiments.
Figure 17:
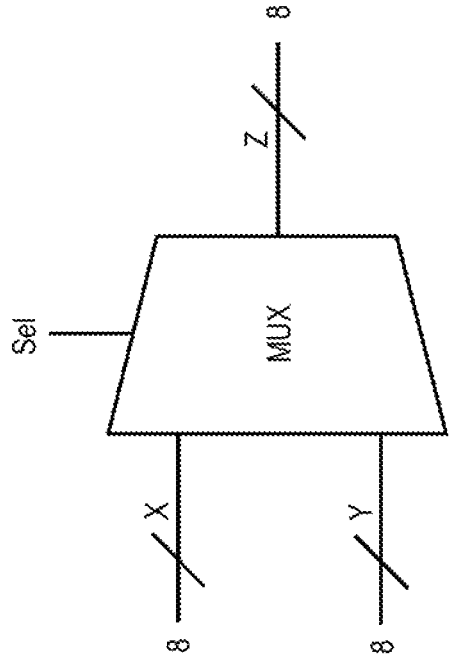
FIG. 17 is a block diagram of custom function block design examples according to some embodiments.
Figure 17:
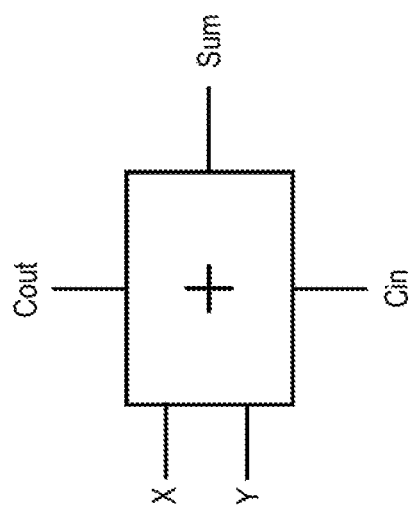

The FPGA elements 104 comprise circuitry configured to provide functionality of an FPGA and/or programmable logic device (PLD). The FPGA elements 104 include I/O macro circuits 110-0 to 110-1. The I/O macro circuits 110 function to provide complex combinational functions, and/or relatively simple logic gates (e.g., AND, XOR). Example logic function block diagrams are shown in FIG. 17. Although eight I/O macro circuits 110 are shown here, there may be any number of such circuits (e.g., based on the number of rows/columns in the reconfigurable dual-function cell array 102). Further example designs of an I/O macro circuit 110 are shown in FIGS. 15 and 16.

The control logic 108 functions to configure (e.g., program) the memory cells of the reconfigurable dual-function cell array 102 as either storage memory cells or control memory cells. Configuration may occur after manufacturing (e.g., in the field). For example, various applications may have different storage memory and/or logic requirements. The control logic circuit 108 may configure, either automatically or in response to user input, the cells of the reconfigurable dual-function cell array 102 based on the requirements. As requirements change, cells may be once again be reconfigured. In some embodiments, individual cells of the reconfigurable dual-function cell array 102 may have a default configuration as a storage memory cells or a control memory cells. In some embodiments, a default configuration may be a null configuration, and may be reconfigured to either an storage memory cell or control memory cell.

The storage memory elements 106 comprise circuitry for memory operations, e.g., a read and/or write. The storage memory elements 106 include a Y-pass circuit 130 and sense amplifiers 130-0 to 130-7. Although eight sense amplifiers 130 are shown here (one sense amplifier 130 for each column of cells of the reconfigurable dual-function cell array 102), it will be appreciated that any appropriate number of number of sense amplifiers 130 (e.g., based on the number of columns in the reconfigurable dual-function cell array 102) may be used. Generally, a sense amplifier 130 comprises circuitry for reading data from the reconfigurable dual-function cell array 102 (e.g., from the cells programmed as storage memory cells). The sense amplifiers 130 function to sense low power signals from a bitline of the reconfigurable dual-function cell array 102 that represents a data bit (e.g., 1 or 0) stored in a storage memory cell, and amplify the small voltage swing to recognizable logic levels so the data can be interpreted properly by logic outside the reconfigurable dual-function cell array 102.

In some embodiments, a processing system 100 including a matrix of reconfigurable dual-function function cell arrays may be implemented on a single integrated circuit die. The single integrated circuit die may be used independently of other integrated circuit dies and/or be stacked with other integrated circuit dies (e.g., a microprocessor die, a memory die, an FPGA die) in various configurations to further improve performance. For example, a stack may include any combination of layers. Layers may each be a single die. One layer may include the processing system 100 and another layer may include a microprocessor die.

Storage Memory Mode

In a storage memory mode of operation, the control logic circuit 108 sets a configuration value to memory mode (e.g., "low") to configure at least a block (e.g., a sub-array) of the reconfigurable dual-function cell array 102 as storage memory. In some embodiments, the storage memory mode disables the FPGA functions (e.g., output functions of the FPGA elements 104). Bit line decoders/address buffers 140, word line decoders/address buffers 150 and/or Y-pass 120 address cells or rows of cells. Data is transferred in or out of the memory cells. The sense amplifiers 120 connect to internal or external wiring channels.

FPGA Mode

In an FPGA mode of operation, the control logic circuit 108 sets a configuration value to logic mode (e.g., "high") to configure at least a portion of the reconfigurable dual-function cell array 102 for performing logic functions. In some embodiments, the FPGA mode disables memory circuit 106 and enables FPGA elements 104. Address buffers may supply the address to the reconfigurable dual-function cell array 102 to perform the logic function. The output of the reconfigurable dual-function cell array 102 (e.g., an AND-OR array) connects to I/O macro circuits 110. The I/O macro circuits 110 receive the configuration data from the logic arrays. The configuration data configures the I/O macro circuits 110 to generate results based on the configuration data.

Figure 2:
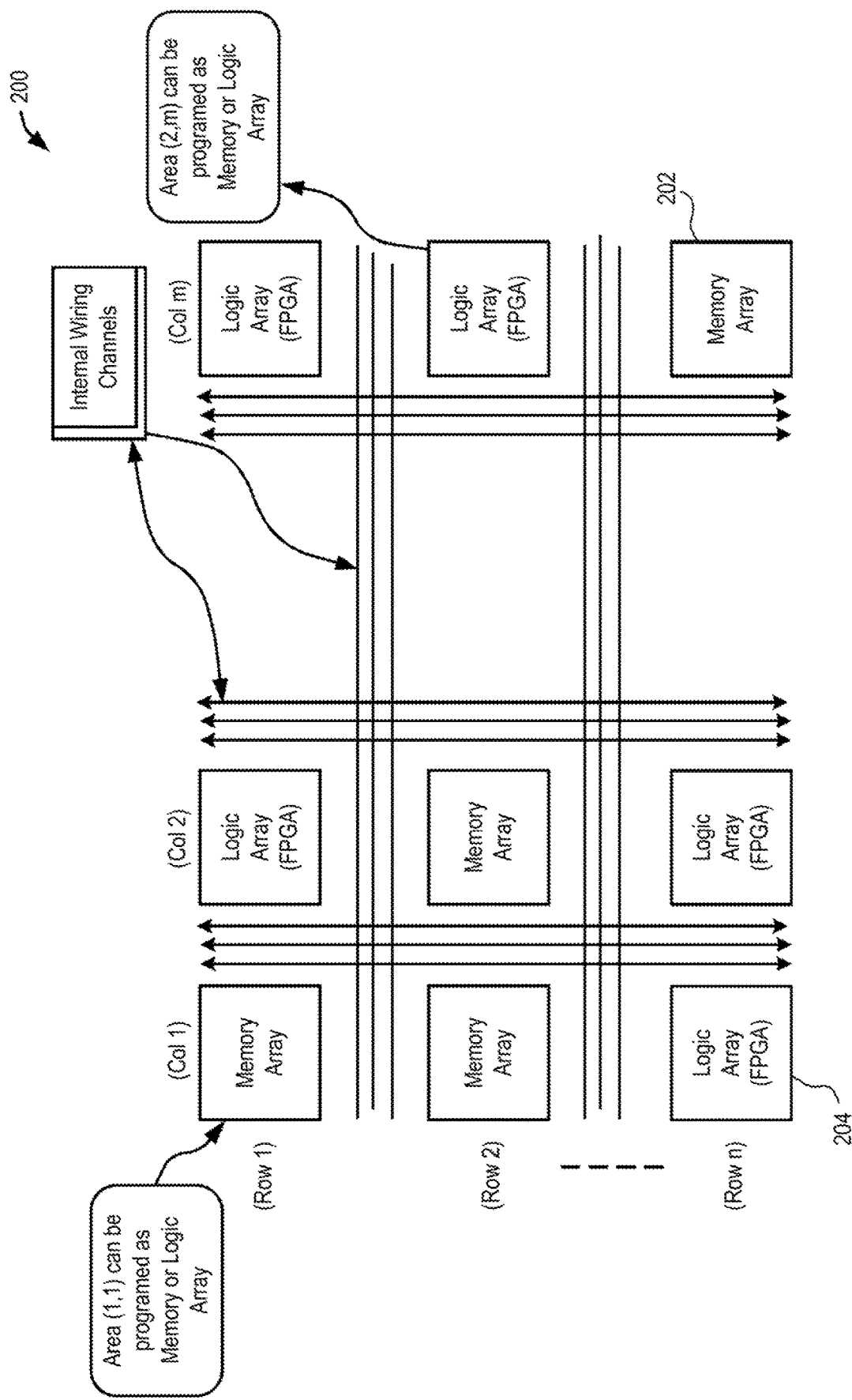
FIG. 2 is a block diagram of a matrix of reconfigurable dual function cell arrays according to some embodiments.

FIG. 2 is a block diagram of a matrix 200 of reconfigurable dual function cell arrays 102 according to some embodiments. The matrix 200 includes storage memory and logic arrays. As shown, some arrays may be programmed as storage memory arrays and some arrays may be programmed as logic arrays. When a design or application requires more storage memory arrays, the storage memory array can be reconfigured (e.g., reprogrammed) from a logic memory array into a storage memory array. When a design or application requires more logic arrays, the storage memory array can be reconfigured (e.g., reprogrammed) from a storage memory array into a logic array. This approach can increase the efficacy of memory arrays usage and can reduce energy consumption.

Figure 3:
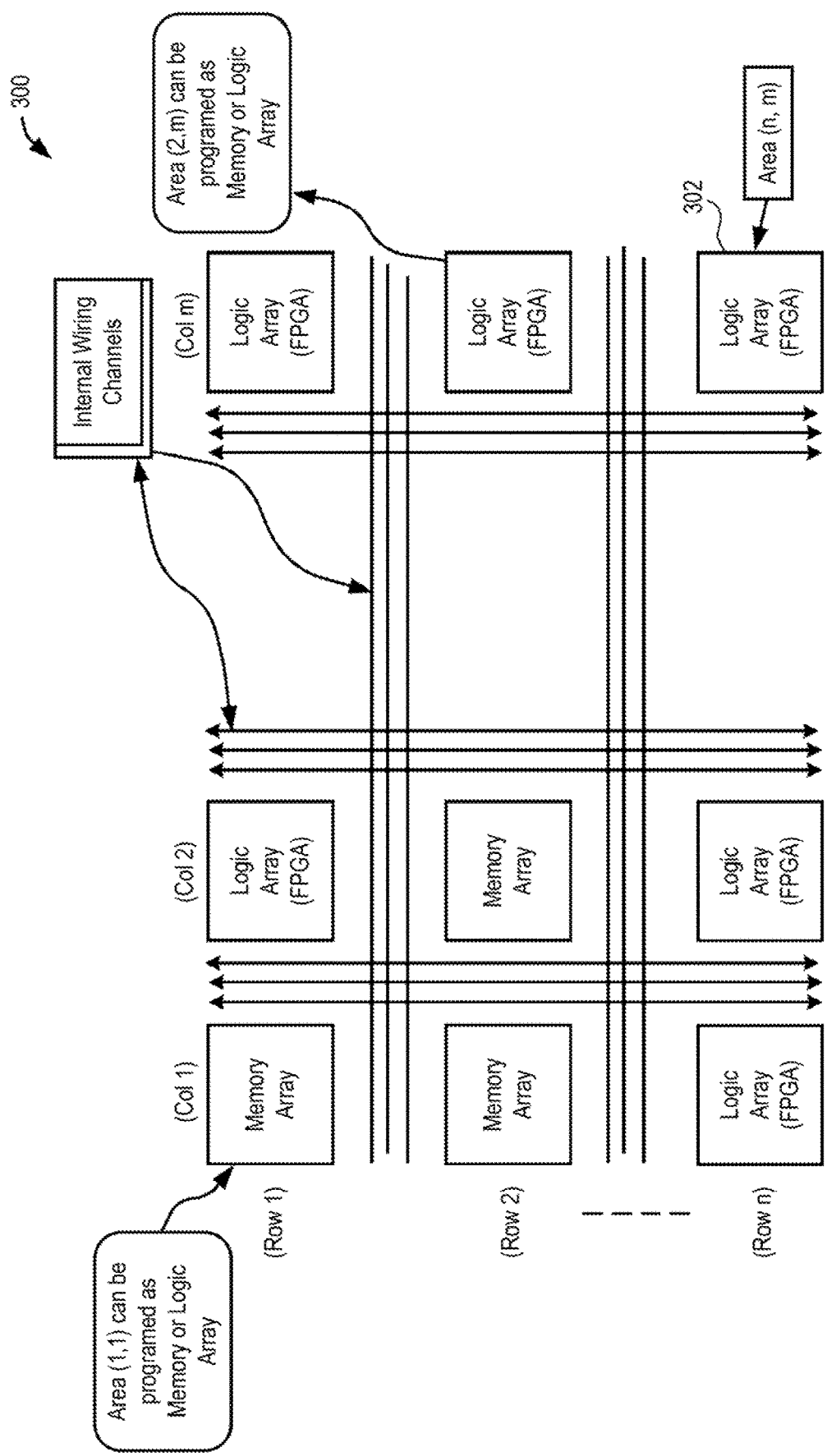
FIG. 3 is a block diagram of a matrix of reconfigurable dual function cell arrays according to some embodiments.

In the example of FIG. 2, the matrix 200 includes a storage memory array 202 at area n,m and a logic array at area n,1 of the matrix 200. The processing system 100 can reconfigure any of the arrays. For example, as shown in FIG. 3, the processing system 100 can reconfigure the storage memory array 202 at area n,m to be a logic array (shown as logic array 302).

Figure 4:
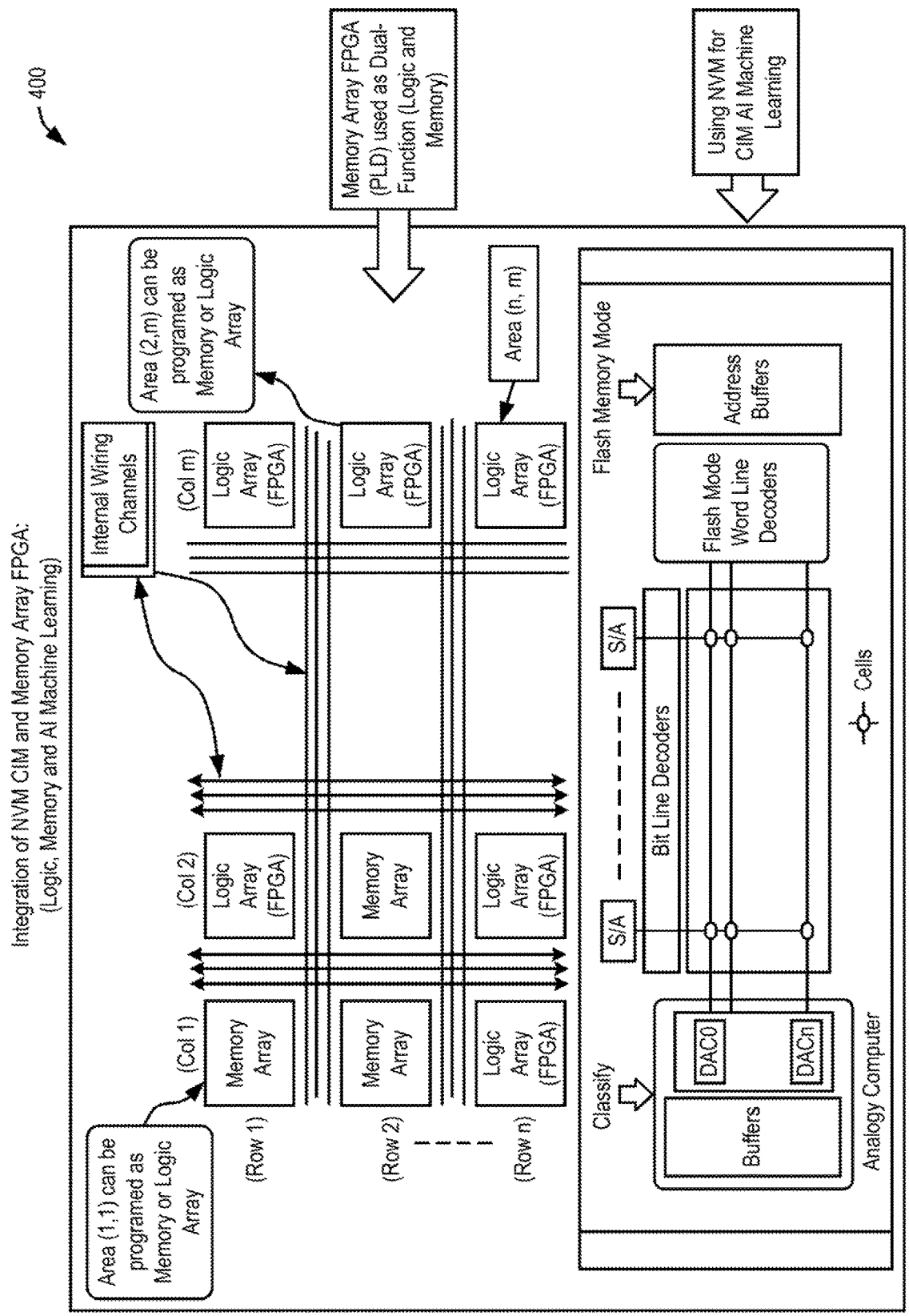
FIG. 4 is a block diagram of an integration of non-volatile memory computation-in-memory and a matrix of reconfigurable dual function cell arrays according to some embodiments.
Figure 5:
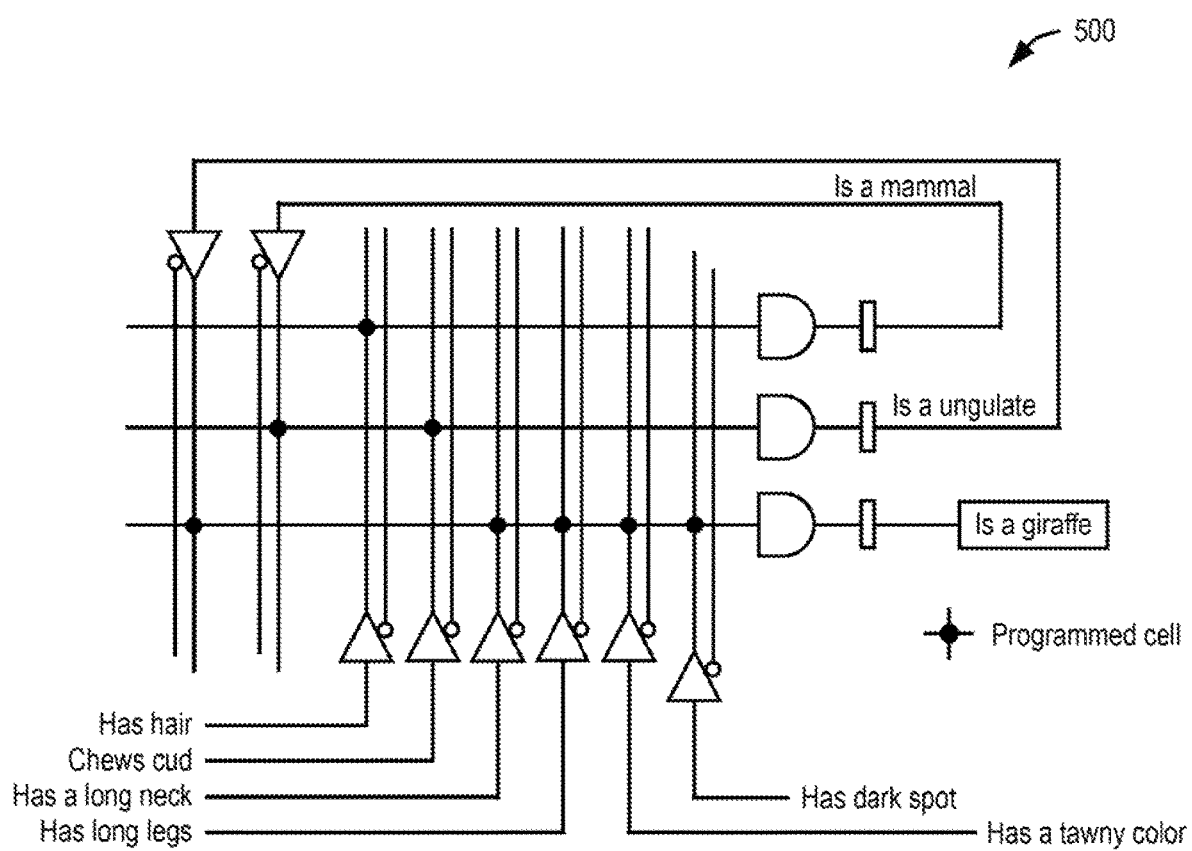
FIG. 5 is a block diagram of a reconfigurable dual function cell array logic implementation of artificial intelligence (AI) identification programming according to some embodiments.

The systems and methods described herein may be particularly beneficial for CIM and artificial intelligence (AI) applications. FIG. 4 shows an example of the integrations of non-volatile memory CIM and a matrix of reconfigurable dual-function cell arrays 102. FIG. 5 shows implementation of an AI identification program.

Figure 6:
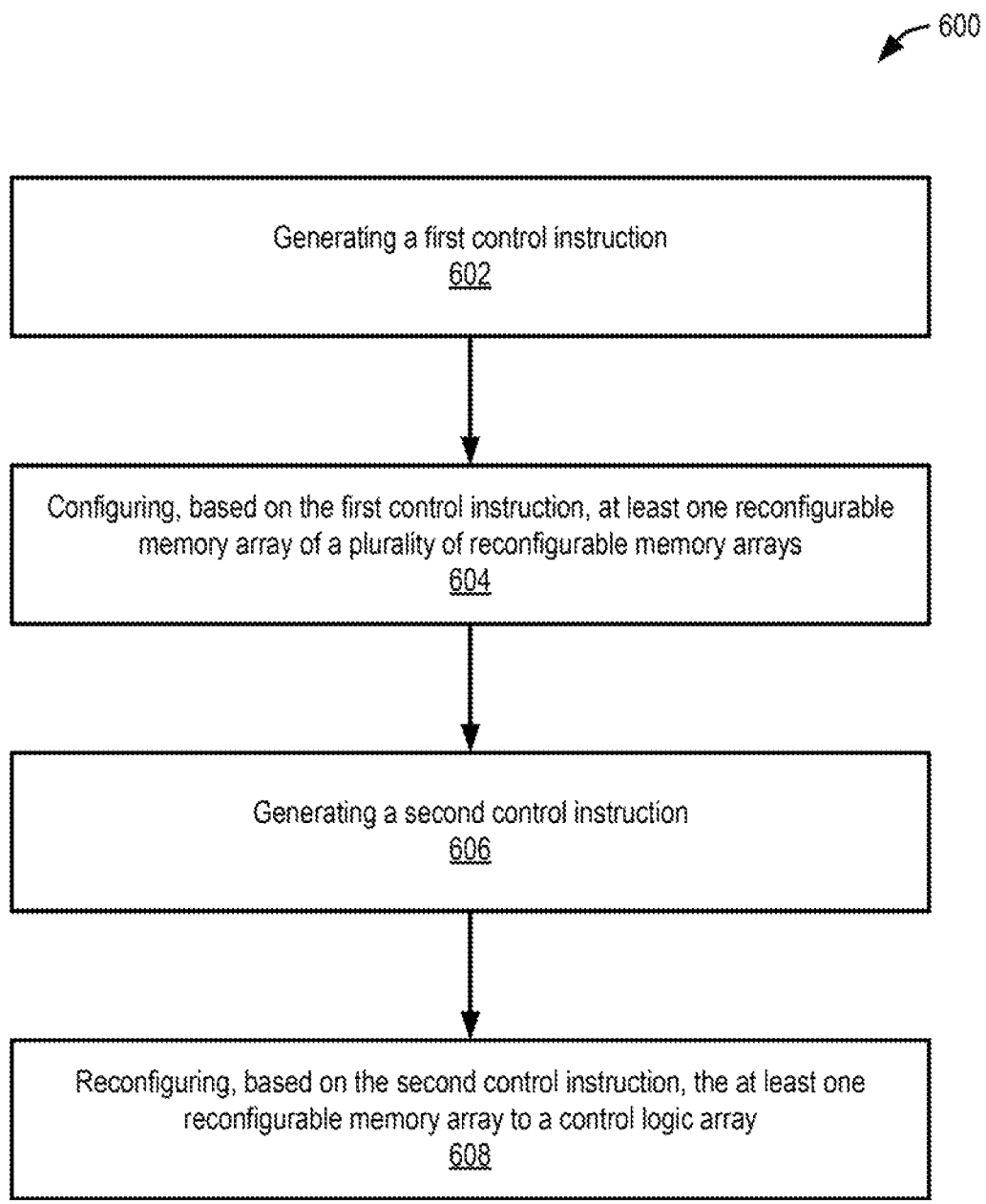
FIG. 6 is a flowchart of a method of configuring and reconfiguring one or more reconfigurable dual function cell arrays according to some embodiments.

FIG. 6 is a flowchart of a method 600 of configuring and reconfiguring one or more reconfigurable dual function cell arrays 102 according to some embodiments. In this and other flowcharts and/or sequence diagrams, the flowchart illustrates by way of example a sequence of steps. It should be understood the steps may be reorganized for parallel execution, or reordered, as applicable. Moreover, some steps that could have been included may have been removed to avoid obscuring the invention and for the sake of clarity and some steps that were included could be removed, but may have been included for the sake of illustrative clarity.

In step 602, a processing system (e.g., processing system 102) generates a first control instruction. For example, the first control instruction comprises an output instruction (e.g., signal) to set storage memory functionality of a block (e.g., a sub-array) of storage memory elements (e.g., storage memory elements 106) for one or more programmable cells of at least reconfigurable dual-function cell array (e.g., reconfigurable dual-function cell array 102). In some embodiments, a control logic circuit (e.g., control logic circuit 108) generates the first control instruction.

In step 604, the processing system configures, based on the first control instruction, at least one reconfigurable memory array of a plurality of reconfigurable memory arrays (e.g., matrix 200) as a storage memory array (e.g., memory array 202). Each reconfigurable memory array of the plurality of reconfigurable memory arrays may be capable of configuration and reconfiguration as a storage memory array (e.g., fast access memory/cache) or a control logic array for controlling one or more field-programmable gate arrays (e.g., I/O macro unit(s) 110 and/or other element(s) of FPGA elements 104) of the integrated circuit die element. In some embodiments, the control logic 108 establishes the configuration.

In step 606, the processing system generates a second control instruction. For example, the second control instruction may comprise an instruction (e.g., signal) to set FPGA functionality for the one or more programmable cells (e.g., a sub-array) of the at least one reconfigurable dual-function cell array (e.g., that were programmed as storage memory in step 604). In some embodiments, the control logic 108 generates the second control instruction.

In step 608, the processing system reconfigures, based on the second control instruction, the at least one reconfigurable memory array to a control logic array (e.g., logic 302). For example, the control logic may reconfigure at least a portion of the programmable memory cells operating as the storage array to be reconfigured as the logic array.

Similar steps may also be performed to reconfigure logic arrays to memory arrays. In some embodiments, cells may be reconfigured any number of times.

In some embodiments, the control logic circuit 108 functions to configure and reconfigure at least one of the plurality of reconfigurable memory arrays automatically or based on user input after manufacturing and deployment of the integrated circuit die element. Accordingly, processing system may be more flexible and/or adaptable than prior solutions.

In one example, the plurality of reconfigurable memory arrays comprises a matrix of reconfigurable memory arrays (e.g., matrix 200). A particular row (e.g., row n) of the matrix of reconfigurable memory arrays includes a first reconfigurable memory array (e.g., memory array 202) being any of configured or reconfigured as a particular storage memory array, and a second reconfigurable memory array (e.g., logic array 204) being any of configured or reconfigured as a particular control logic array for controlling one or more field-programmable gate arrays (I/O macro unit(s) 110 and/or other element(s) of FPGA elements 104) of the integrated circuit die element. The storage memory array may operate as a fast access memory array (e.g., cache).

It will be appreciated that reconfigurable dual function cell array 102 may include Through Silicon Vias (TSVs) for interconnecting with a microprocessor as described in U.S. Pat. No. 7,126,214. Further, it will be appreciated that a system can use any number of reconfigurable dual function cell arrays 102, e.g., one stacked upon another. For example, a system can use a microprocessor coupled to a die package, and one or more reconfigurable dual function cell arrays 102 stacked on the microprocessor to create a stacked die product. The distance from the microprocessor may affect the relative performance of the array 102. Various algorithms may be used to control which layer the microprocessor uses.

Non-Volatile Memory Embodiments

FIGS. 7-13 relate to embodiments utilizing non-volatile memory. Under some approaches, non-volatile memory data read-out operations are performed using fixed references as reference input for a sense amplifier. In one example, a fixed reference includes one fixed reference point for sense amplifiers to sense data out. However, fixed reference voltages cannot compensate for non-volatile memory cells' electrical variations (CD) and/or manufacturing process deviations, which may create significant electrical changes of cell's read current. Further, the physical size of non-volatile memory cells is shrinking and complex process technology create more cell electrical variations, which can drastically impact non-volatile cells' electrical characteristics. Fixed references cannot manage non-volatile memories cells' wide electrical margin, PCM reliability issues, resistance drift, cell variability, thermal crosstalk and circuit noise from read/write circuitry, ambient temperature, and/or the like.

Figure 7:
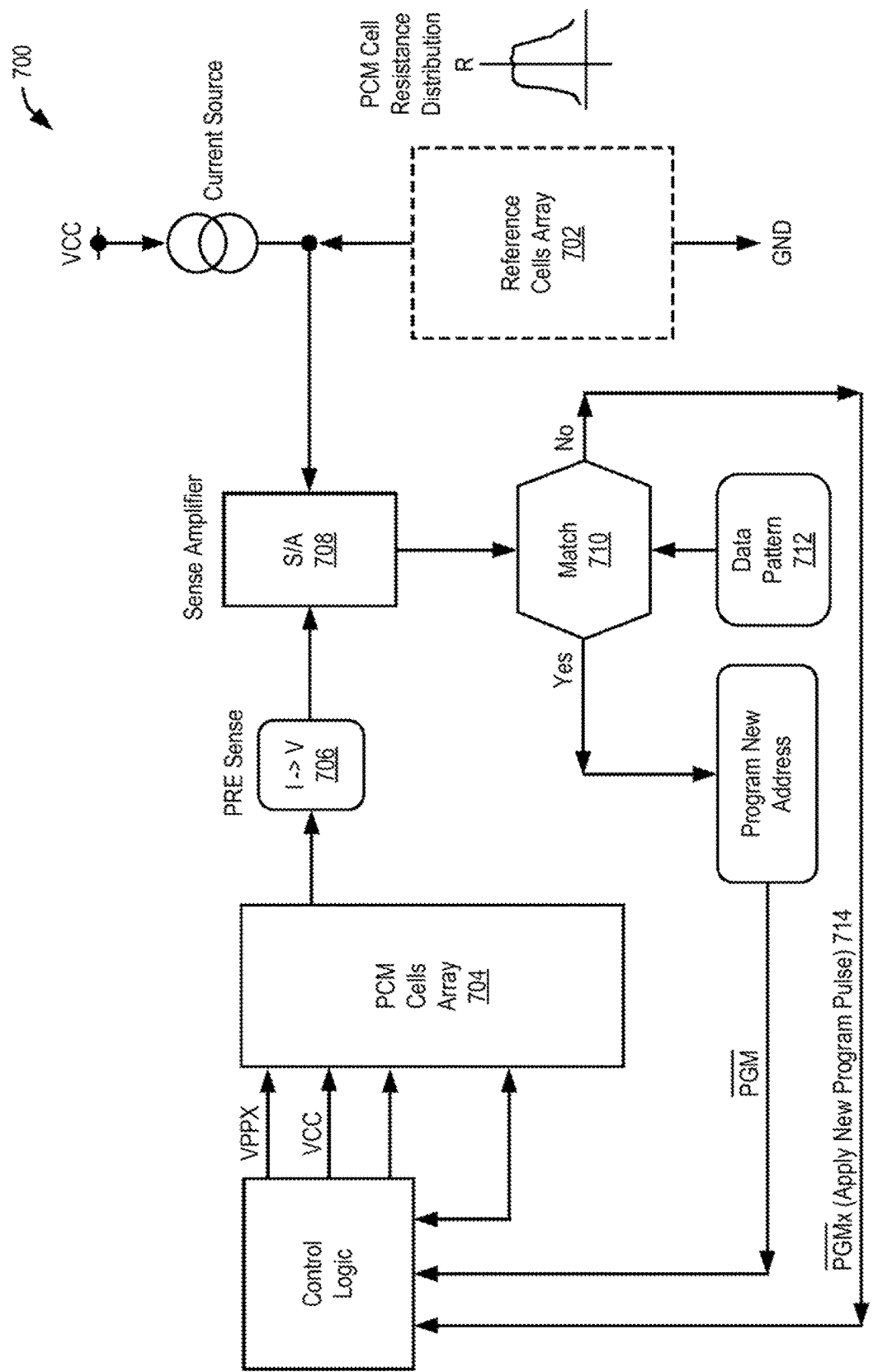
FIG. 7 is a block diagram of a Phase Change Memory (PCM) circuit design having non-volatile memory programming control logic and intelligent program mode with data read out circuits according to some embodiments.

FIG. 7 is a block diagram of a Phase Change Memory (PCM) circuit design 700 having non-volatile memory programming control logic and intelligent program mode with data read out circuits according to some embodiments. The circuit design 700 includes a fixed reference array 702. As noted above, fixed reference arrays may be ineffective for non-volatile memory embodiments.

The PCM cells array 704 includes a reconfigurable dual-function function cell array with PCM. The PRE S/A (I/V) 706 includes pre-sense amplifier circuits which may convert current level to voltage levels. The sense amplifier 708 includes a memory array sense amplifier.

The compare (or, match) circuit block 710, if the output of sense amplifier 708 matches with program data pattern 712, is set to YES, and loads the next byte data. If there is no match, enable NO and apply program pulse 714 again to reprogram the current bytes to repeat the programming step.

The PGM circuit includes memory cells program control logic. The PGM may determine whether a memory cell is under programming or read function.

If a match occurs, start next byte to program next (new) memory. Set a PGM pulse. The PGM(bar) is off.

The reference cells array 702 includes pre-determined reference cells as the input of the sense amplifier 708.

Figure 8:
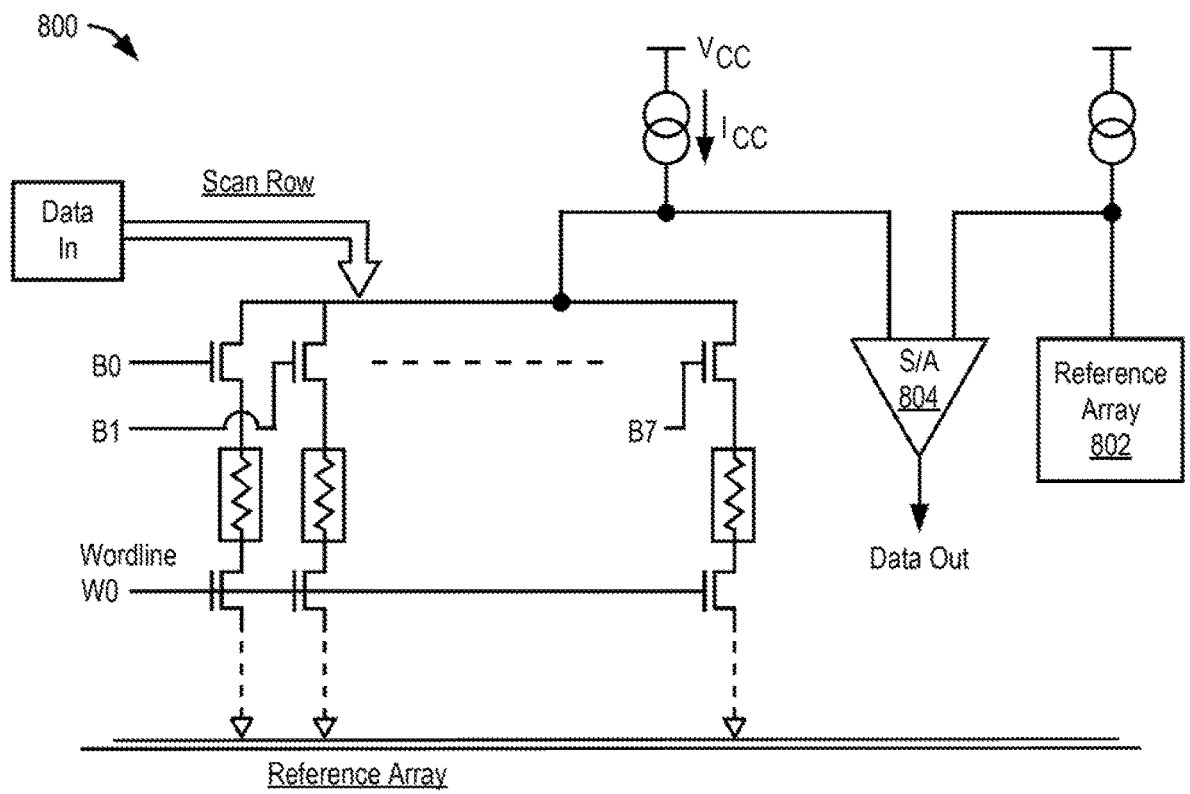
FIG. 8 is a block diagram of a circuit design having a scan row and fixed sense amplifier reference cell according to some embodiments.

FIG. 8 is a block diagram of a circuit design 800 having a scan row and fixed sense amplifier reference according to some embodiments. The circuit design 800 includes a dynamic reference array 802 and sense amplifier 804.

FIG. 8 shows a scan row-circuit diagram of PCM memory cell array and scan row block. B0, B1, to B7 are bit line decoder control gates. The word line W0 is the word line of memory cells. The data-in (0-7) is the data input for programming data during memory scan setup.

Figure 9:
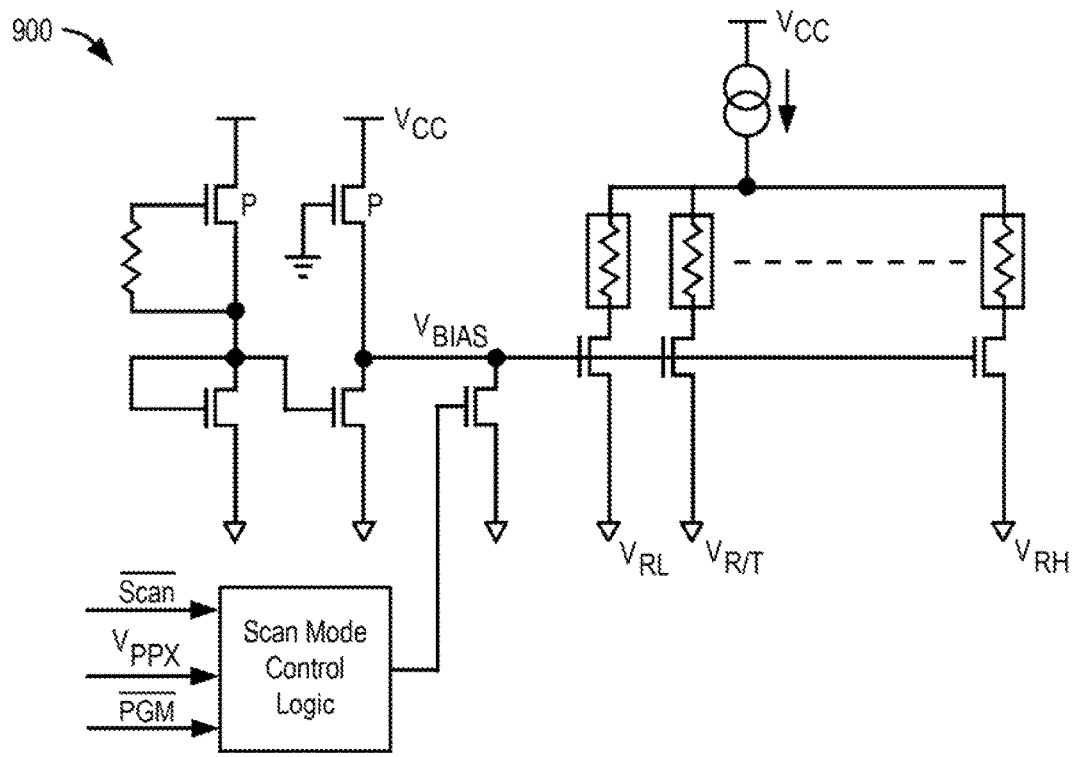
FIG. 9 is a block diagram of a circuit design having a dynamic reference array as sense amplifier reference voltages according to some embodiments.

FIG. 9 is a block diagram of a circuit design 900 providing a dynamic reference array as sense amplifier reference voltages according to some embodiments.

In some embodiments, the circuit design 900 is the circuit diagram of the dynamic reference array 802. The V-bias is the reference voltage. The scan mode control logic enables the V-bias, the fixed reference voltage (pre-determined by design), and/or adjusting the dynamic reference array reference voltage, such as $V_{RL}$, $V_{RT}$ . . . , $V_{RH}$. The selections of $V_{RL}$ or $V_{RH}$ are determined by the outcome of the scan row's results. The voltage values of the sense amplifier 804 reference side depended on by the V-bias, VRL, and/or VRH, etc. After the scan mode determines the $V_{RH}$, $V_{RT}$, or $V_{RH}$ values, the sense amplifier reference voltage value may be a fix-voltage. During a normal read/write mode, the scan mode control logic may be "Low." The V-bias may be a fixed reference voltage.

Generally, a sense amplifier (e.g., sense amplifier 130) may sense bits from a bitline that represents a data bit (1 or 0) stored in a memory cell, and amplify the small voltage swing to recognizable logic levels so the data can be interpreted properly by logic outside the memory. Under traditional approaches, a sense amplifier uses a fixed reference value. For example, data may range from 1 volt (V) to 5V, and a fixed reference value may be 3V. If the signal is above the fixed reference value, then the sense amplifier may set or otherwise indicate the signal as "high", and if the signal is below the fixed reference value, then the sense amplifier may set or otherwise indicate the signal as "low". However, because non-volatile memory has reliability issues, resistance drift, cell variability, thermal crosstalk and circuit noise from read/write circuitry, and/or be susceptible to changes in temperature due to ambient temperature and/or other factors, the voltages stored in memory cells may fluctuate. Accordingly, a fixed reference value may be ineffective.

Figure 14:
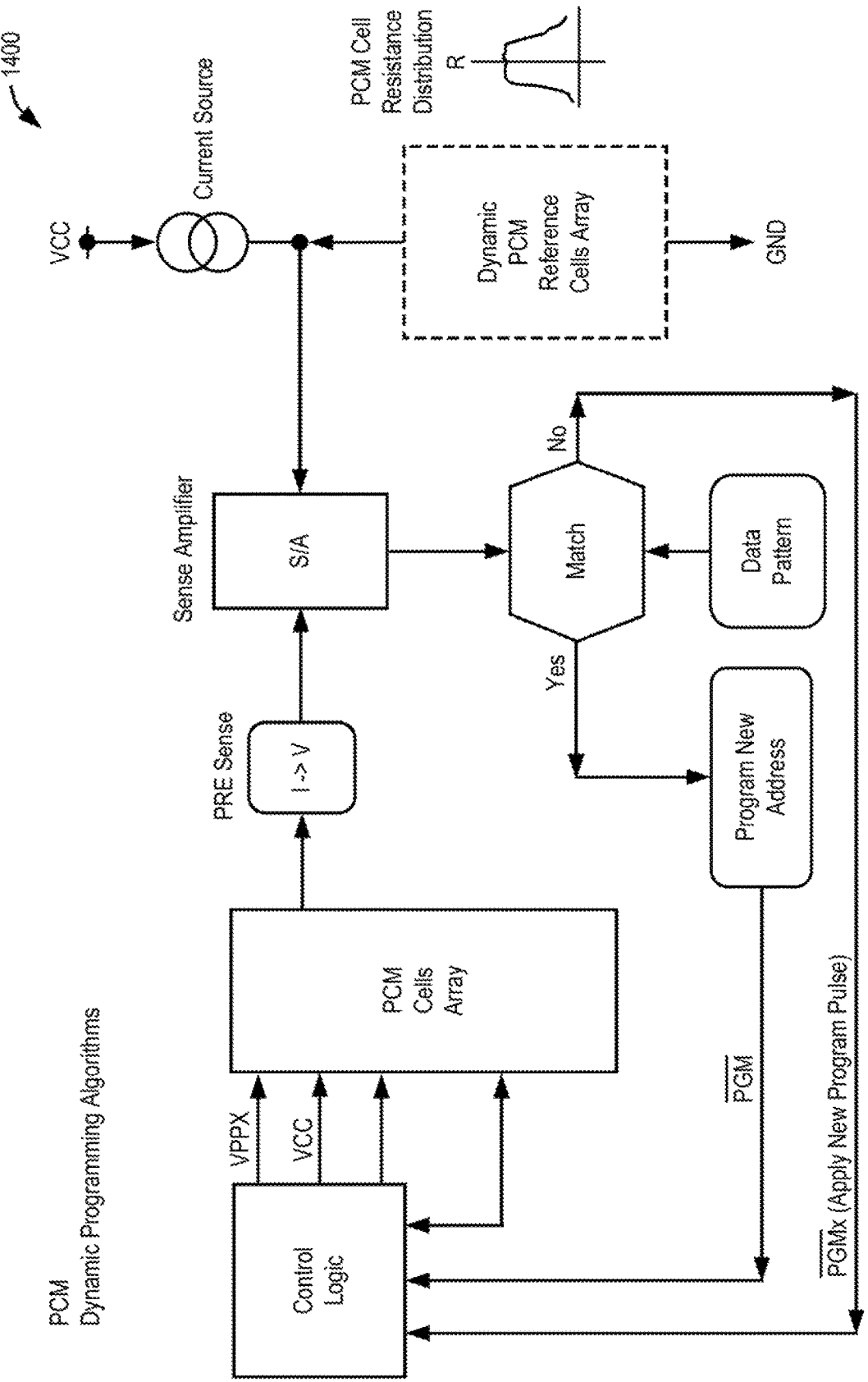
FIG. 14 is a block diagram of dynamic programming algorithms according to some embodiments.

The circuit design 900 providing a dynamic reference array covers various factors for read/write circuits and may allow sense amplifiers (e.g., sense amplifiers 130) to cover wide range of cells' functionality. For example, the circuit design 900 may overcome PCM reliability issues, resistance drift, cell variability, thermal crosstalk and circuit noise from read/write circuitry, ambient temperature, and/or the like. Furthermore, the dynamic reference array circuit design 900 may improve product yield, translating to lower production cost. An example dynamic programming algorithm for a dynamic reference array is shown in FIG. 14.

In some embodiments, the dynamic reference array uses multiple references to increase a sense amplifier's sense ranges and improve data read out results. The Vbus voltages may be adjusted to cover the various factors, thereby providing a dynamic range of reference values. For example, as shown in the circuit design 900, a lower Vbus voltage may provide higher reference values, and lower Vbus voltages may provide lower reference values. Accordingly, even if voltages stored in the reconfigurable dual-function cell array 102 change in value (e.g., due to the factors described above) the changes may be managed by the dynamic reference array. In some embodiments, the circuit design 900 implements one or more dynamic reference array algorithms.

Scan Mode:
i. Programming and verifications on predefined Scan Rows.
 1. Apply program current/voltage to program selected cells (bytes), then remove program current pulses then switching to Read Mode and to verify the programming results by Read out Scan Row's data to compare the programming data-In.
 2. To select Reference Array's typical cell as Reference, Vref. RH.
 3. Programming Data-in match Read out Data. Set Status Register R0 to 1.
 4. Programming Data-in does not match Read out Data, Set Status Register R0 to 0
 5. To switch Reference cell to Reference, Vref. T., and to perform Scan Row Data read out.
 6. Programming Data-in match Read out Data. Set Status Register R1 to 1.
 7. Programming Data-in does not match Read out Data, Set Status Register R1 to 0.
 8. To switch Reference Cell to Reference, Vref. RL and to perform Scan Row Data read out.
 9. Programming Data-in match Read out Data. Set Status Register R2 to 1.
 10. Programming Data-in does not match Read out Data, Set Status Register R2 to 0.
 11. Decode Status Register three bits, R0, R1, R2. Set Reference Cell by select two register bits are 1 s. Examples are shown in FIGS. 10-13. Set Scan Mode is Done and different Vref levels.

Data-In: Data to be programmed.
Data-Out: Data Read out by Sense Amplifier.
Match: Data-In=Data-Out. (Programmed data matches Read-out data.)

Data Read Out Mode
After Reference Array cell was selected by Scan Mode (Done). Set the Selected Reference as future Read Mode and Programming/verification Mode's reference cell. No longer need to use Scan Mode anymore.

Programming/Data Verification Mode:
After Scan Mode (Scan Mode is Set). No longer need to scan data anymore. User may just to program the bits and verify to Data-in vs Data-out by using after Scan Mode's Reference.

By Passing Scan Mode:
For using bit to by passing Scan Mode is allowing Manual setup selecting one of the Reference Array Cell as reference for Sense Amplifier.

Enable Scan Mode:

To enable scan mode bit or decode scan mode to Enable scan Mode. After Enable scan Mode, Repeating Step A, Scan Mode.

Figure 10:
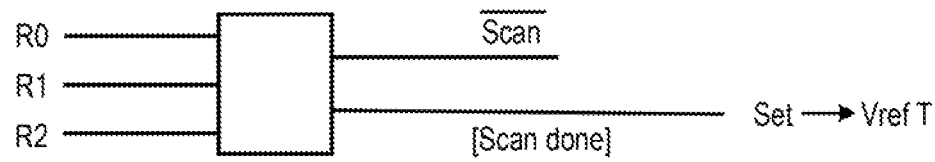
FIG. 10 is a block diagram of an example of setting status registers for scan logic and reference array for case A1 and case A2 according to some embodiments.

FIG. 10 is a block diagram of an example of setting status registers for scan logic and reference array for case A1 and case A2 according to some embodiments.

In case A1, example 1 is an 8-bit register to store the dynamic reference array's reference values, $V_{RL}$, $V_{RT}$, and $V_{RH}$.

In case A2, example 2 sets R0 to 0, R1(=$R_T$), R2(=$R_H$). In this case, the system SET→$V_{RT}$, $V_{RH}$.

In some embodiments, the system detects two passing V-reference stats to use one V-reference as input of the sense amplifier.

FIG. 11 is a block diagram of an example of setting status registers for scan logic and reference array for case A3 and case A4 according to some embodiments.

In case A3, example 3 SET→$V_{RL}$.

In case A4, example 4 SET→Not recommended case→Weak bit.

In some embodiments, the system detects two passing V-reference stats to use one V-reference as input of the sense amplifier.

Figure 12:
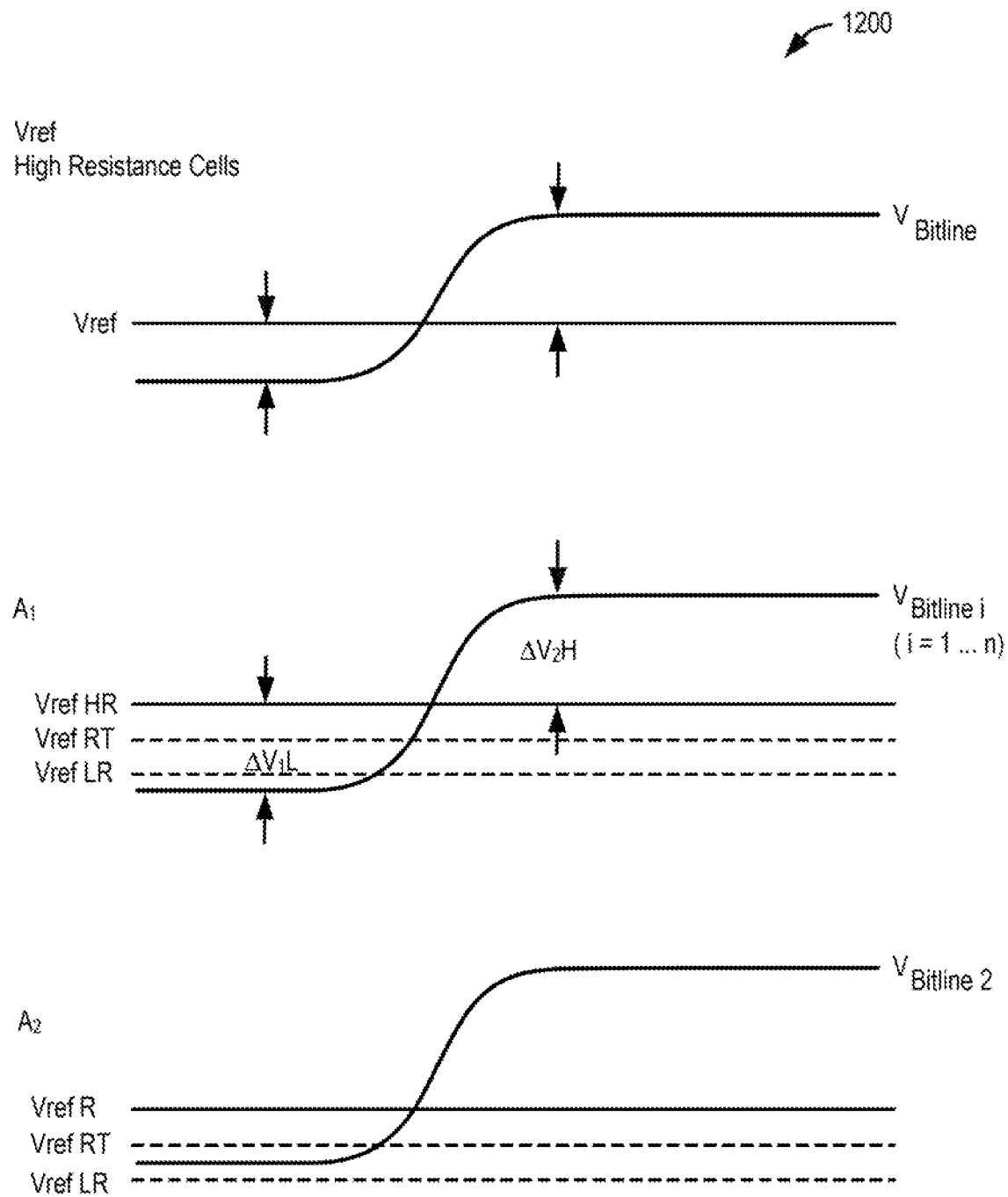
FIG. 12 is a block diagram of waveforms for sense amplifier for case A1 and A2 according to some embodiments.

FIG. 12 is a block diagram of waveforms for sense amplifier for case A1 and A2 according to some embodiments. Vbitline is Sense Amplifier Data-Out waveform vs. different three Reference voltages, Vref. HR, Vref,RT and Vref, LR.

In the example of FIG. 12, the sense amplifier bit-line voltage levels are shown versus the reference voltage generated from the dynamic reference array.

Wave forms of high resistance cells, fixed Verf. Are shown versus bit-line voltage level. Read "0" and "1".

In case A1, a status register setup is shown for wave-forms of VRH, VRT, and VRL versus bit-line voltage level.

In case A2, a status register setup is shown for wave-forms of VRH, VRT, and VRL versus bit-line voltage level.

Figure 13:
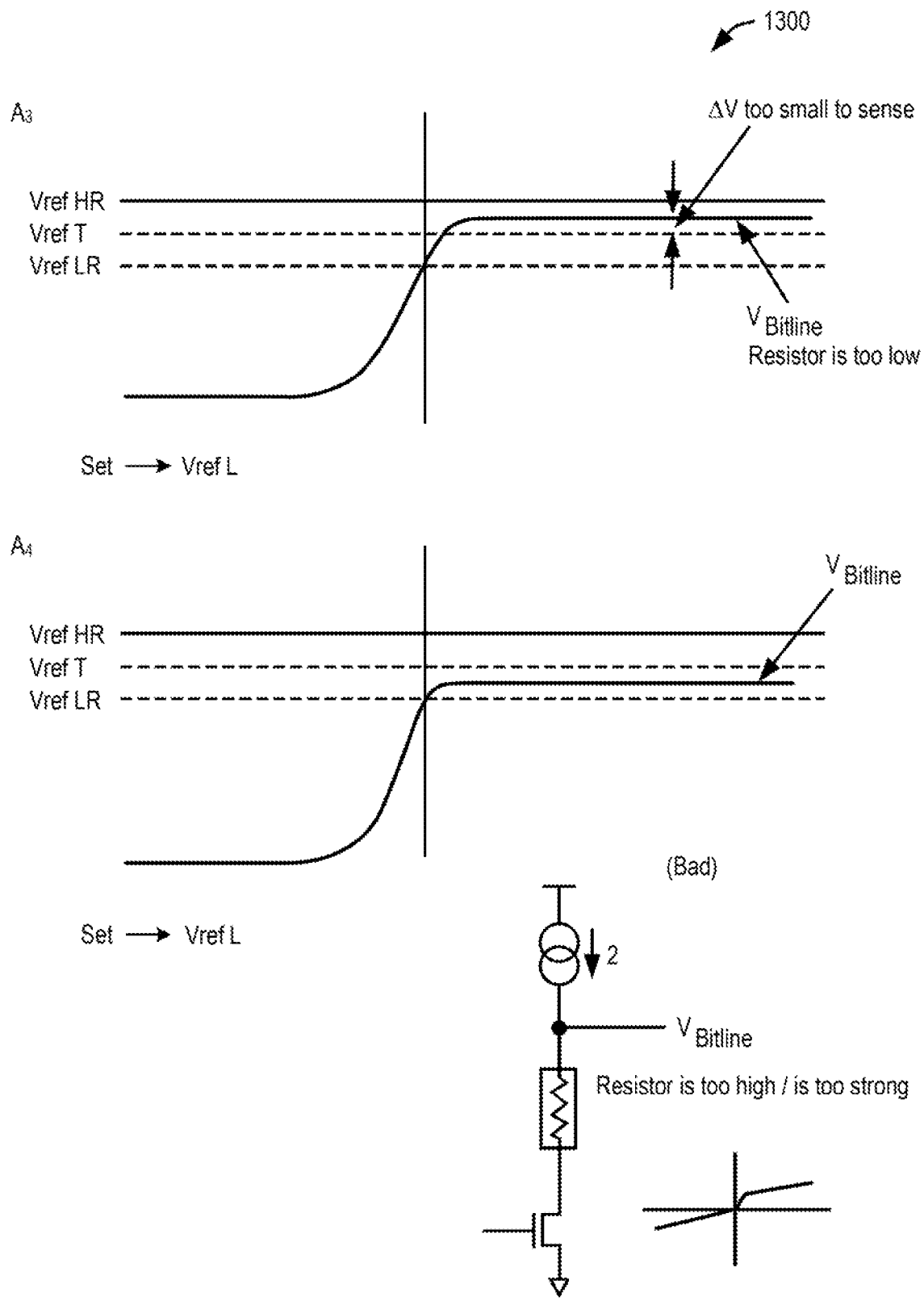
FIG. 13 is a block diagram of a Waveforms for Sense Amplifier for case A3 and A4 according to some embodiments.

FIG. 13 is a block diagram of a Waveforms for Sense Amplifier for case A3 and A4 according to some embodiments. Vbitline is Sense Amplifier Data-Out waveform vs. different three Reference voltages, Vref. HR, Vref,RT and Vref, LR.

In the example of FIG. 13, the sense amplifier bit-line voltage levels are shown versus reference voltage generated from the dynamic reference array.

Wave forms of high resistance cells, fixed Verf. Are shown versus bit-line voltage level. Read "0" and "1".

In case A3, a status register setup is shown for wave-forms of VRH, VRT, and VRL versus bit-line voltage level.

In case A4, a status register setup is shows for wave-forms of VRH, VRT, and VRL versus bit-line voltage level.

FIG. 14 is a block diagram of dynamic programming algorithms according to some embodiments.

In some embodiments, when PCM cells array (e.g., reconfigurable dual-function cell array 102) is in programming mode, the # PCM signal is pulsed. PCM cell program electrical characteristic may be used to determine the # PCM pulse width. Different manufacturers and technologies could use different # PCM pulse width. After programming the PCM cells array, the PCM Dynamic programming algorithms may switch to read mode and output of sense amplifier may compare the programming data pattern. If a match occurs, then YES is set, and program new address. If there is no match, then PGMx applies a new program pulse to program the PCM cells array one more pulse. Then, the system reads/verifies again until a match occurs and/or exceeds a predetermined number of pulses. Stop programming functions. The PCM reference cells array may provide the proper reference voltage.

FIG. 15 is a block diagram of a reconfigurable dual function cell array macro design 1500 according to some embodiments. A function diagram includes multiple paths, and a macro cell selection decoder may be programmed by using fixed PCM cells or a special row of PCM cells to perform the selections of S1,S2, S3, S4, SN connecting different functions. It may use wiring connectives.

FIG. 16 is a block diagram of a reconfigurable dual function cell array macro cell selection circuit according to some embodiments. FIG. 16 is the circuit of the macro cell selection decoder according to some embodiments.

FIG. 17 is a block diagram of custom function block design examples according to some embodiments. Logic Functions may be fixed functions blocks "Adder" or "Multiplier."

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein. It will further be appreciated that the term "or," as used herein, may be construed in either an inclusive or exclusive sense.

The present invention(s) are described above with reference to example embodiments. It will be apparent to those skilled in the art that various modifications may be made and other embodiments may be used without departing from the broader scope of the present invention(s). Therefore, these and other variations upon the example embodiments are intended to be covered by the present invention(s).

The invention claimed is:

1. An integrated circuit die element comprising:
a field-programmable gate array (FPGA) including one or more FPGA elements, each of the one or more FPGA elements having a configuration based on configuration data;
a reconfigurable dual function memory array, the reconfigurable dual function memory array including a plurality of reconfigurable memory array blocks, each reconfigurable memory array block being capable of configuration and reconfiguration as a storage memory array block at one time or as a control logic array block at a different time, the reconfigurable memory array block configured to store process data when the reconfigurable memory array block is configured as the storage memory array block, the reconfigurable memory array block configured to store the configuration data for controlling the configuration of at least a portion of the one or more FPGA elements when the reconfigurable memory array block is configured as the control logic array block; and
a control logic circuit functioning to configure each reconfigurable memory array block as the respective memory array block at the one time and as the respective logic array block at the different time.

2. The integrated circuit die element of claim 1, wherein the reconfigurable dual function memory array includes:
   a first reconfigurable memory array block configured as the storage memory array block, and
   a second reconfigurable memory array block configured as the control logic array block.

3. The integrated circuit die element of claim 1, wherein the storage memory array block comprises cache memory.

4. The integrated circuit die element of claim 1, wherein the control logic circuit functions to configure at least one reconfigurable memory array block after manufacturing and deployment of the integrated circuit die element.

5. The integrated circuit die element of claim 1, wherein the control logic circuit functions to switch a particular reconfigurable memory array block from the storage memory array block to the control logic array block.

6. The integrated circuit die element of claim 1, wherein the control logic circuit functions to switch a particular reconfigurable memory array block from the control logic array block to the storage memory array block.

7. The integrated circuit die element of claim 1, wherein the integrated circuit die element comprises a stack of integrated circuit dies, the stack including a first reconfigurable dual function memory array die and a microprocessor die.

8. The integrated circuit die element of claim 7, wherein the stack further comprises a second reconfigurable dual function memory array die.

9. The integrated circuit die element of claim 7, wherein the stack further comprises an FPGA die or memory die.

10. A method comprising:
    storing, by a control logic circuit, a first control value;
    configuring, based on the first control value, at least one reconfigurable memory array block of a reconfigurable dual function memory array as a storage memory array block or as a control logic array block, each reconfigurable memory array block of the reconfigurable dual function memory array being capable of configuration and reconfiguration as the storage memory array block at one time or as the control logic array block at a different time, the reconfigurable memory array block configured to store process data when the reconfigurable memory array block is configured as the storage memory array block, the reconfigurable memory array block configured to store configuration data for controlling configuration of one or more field-programmable gate array (FPGA) elements of an FPGA when the reconfigurable memory array block is configured as the control logic array block;
    obtaining, by the control logic circuit, a second control value; and
    reconfiguring, based on the second control value, the at least one reconfigurable memory array block.

11. The method of claim 10, wherein the reconfigurable dual function memory array includes:
    a first reconfigurable memory array block configured as the storage memory array block, and
    a second reconfigurable memory array block configured as the control logic array block.

12. The method of claim 10, wherein the storage memory array comprises cache memory.

13. The method of claim 10, wherein the control logic circuit functions to configure at least one reconfigurable memory array block after manufacturing and deployment of the integrated circuit die element.

14. The method of claim 10, further comprising:
    switching, by the control logic circuit, a particular memory array block from the storage memory array block to the control logic array block.

15. The method of claim 10, further comprising:
    switching, by the control logic circuit, a particular control logic array block from the control logic array block to the storage memory array block.

16. The method of claim 10, wherein the integrated circuit die element comprises a stack of integrated circuit dies, the stack including a first reconfigurable dual function memory array die and a microprocessor die.

17. The method of claim 16, wherein the stack further comprises a second reconfigurable dual function memory array die.

18. The method of claim 16, wherein the stack further comprises an FPGA die or memory die.

* * * * *